Figure 1:
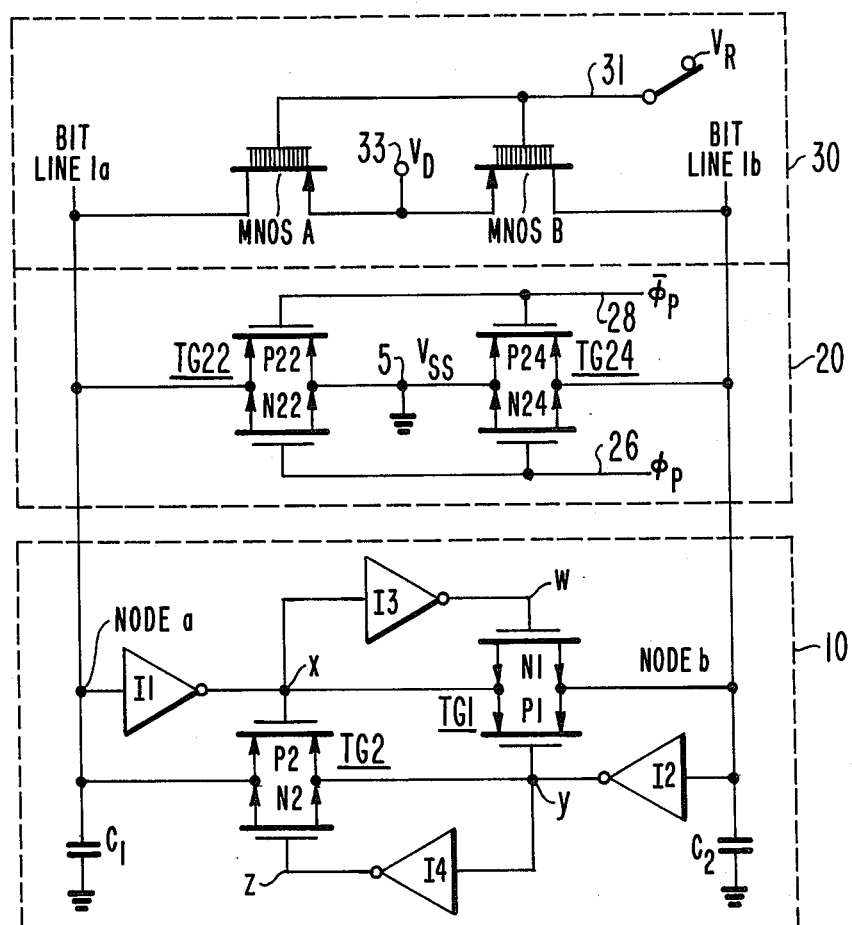

United States Patent [19]

Hollingsworth

[11] 4,096,401

[45] Jun. 20, 1978

[54] SENSE CIRCUIT FOR AN MNOS ARRAY USING A PAIR OF CMOS INVERTERS CROSS-COUPLED VIA CMOS GATES WHICH ARE RESPONSIVE TO THE INPUT SENSE SIGNALS

[75] Inventor: Richard James Hollingsworth, Princeton, N.J.

[73] Assignee: RCA Corporation, New York, N.Y.

[21] Appl. No.: 796,335

[22] Filed: May 12, 1977

[51] Int. Cl.$^2$ .................. H03K 5/20; H03K 3/286; G11C 7/00; G11C 11/34

[52] U.S. Cl. .................. 307/355; 307/238; 307/279; 307/288; 307/362; 307/DIG. 3; 365/184; 365/205

[58] Field of Search ............... 307/238, 355, 362, 363, 307/279, 288, 291, DIG. 3, 200 B; 340/173 R

[56] References Cited

U.S. PATENT DOCUMENTS

| 3,849,673 | 11/1974 | Koo | 307/355 |
|---|---|---|---|
| 3,868,656 | 2/1975 | Stein et al. | 307/DIG. 3 X |
| 3,895,360 | 7/1975 | Cricchi | 307/DIG. 3 X |
| 3,983,545 | 9/1976 | Cordaro | 307/DIG. 3 X |
| 3,992,704 | 11/1976 | Kantz | 307/DIG. 3 X |

OTHER PUBLICATIONS

Chin et al., "Sense Latch for One-Device Memory Cell", IBM *Tech. Discl. Bull.;* vol. 15, No. 11, pp. 3379-3380, 4/1973.

Chu et al., "Low-Power, High-Speed Sense Latch", IBM *Tech. Discl. Bull.;* vol. 17, No. 9, pp. 2582-2583, 2/1975.

*Primary Examiner*—Larry N. Anagnos
*Attorney, Agent, or Firm*—H. Christoffersen; H. I. Schanzer

[57] ABSTRACT

The sense circuit includes first and second inverters, connected at their inputs to first and second nodes, respectively. The inverters are selectively cross-coupled by means of transmission gates whose conduction paths are connected between the output of the first and second inverters, respectively, and the inputs of the second and first inverters, respectively. The control electrodes of the transmission gates are coupled to the first and second nodes whereby the transmission gates are turned on and off in response to the voltage levels at the first and second nodes. In the operation of the circuit a precharge voltage, having a polarity and magnitude to turn off the transmission gates, is applied to the two nodes. Subsequently, first and second current signals, having a polarity to generate potentials to turn on the transmission gates, are applied to the first and second nodes, respectively, altering the potentials at the nodes until the transmission gates are turned on. The two inverters are then cross-coupled and latch to either one of two states depending on the difference in the voltage levels at the two nodes. Unlike previously known sense circuits, the need for clock signals to control the conduction at the cross-coupling transmission gates is avoided, since the signals for controlling the conduction of these transmission gates are derived from points within the sense amplifier itself.

10 Claims, 4 Drawing Figures

SENSE CIRCUIT FOR AN MNOS ARRAY USING A PAIR OF CMOS INVERTERS CROSS-COUPLED VIA CMOS GATES WHICH ARE RESPONSIVE TO THE INPUT SENSE SIGNALS

This invention relates to sense circuits and, in particular, to sense circuits comprising two inverters which are selectively cross-coupled as a function of the data signals applied to the input(s) of the sense circuits.

A known sense circuit includes first and second inverters which are connected at their inputs to first and second signal nodes, respectively. The inverters are selectively cross-coupled by first and second transmission gates whose conduction paths are connected between the outputs of the first and second inverters, respectively, and the inputs of the second and first inverters, respectively. Clock signals are applied to the control electrodes of the transmission gates for turning them on and off. The clock signals initiate and terminate each "read" cycle, which cycle includes a precharge period followed by a data sense period. In general, the clock signals turn off the transmission gates during the precharge and sense period. During precharge, the first and second nodes are charged (discharged) to a first voltage level. During the "sense" period, signal currents, representing the data to be sensed, are supplied to the signal nodes altering (discharging or charging) their percharge condition. The sense period is terminated when the clock signals turn on the transmission gates. The inverters are then cross-coupled and latch to either one of two states depending on the sense of the potential difference between the two signal nodes.

A problem exists with the known circuit. When the clock signals turn on the transmission gates cross-coupling the inverters, the current signals into the first and second nodes may have been applied for too short a duration and/or may have been so small in amplitude, that the levels at the nodes may not have been discharged (charged) to a level of sufficient amplitude to drive the inverters and cause the circuit to go to a state corresponding to the data being read. Alternatively, if the current signals are of large amplitude and/or if the sense period is too long, then the first and second nodes will be fully discharged (charged) and the signal information will be lost.

Therefore, in prior art circuits, special timing and control circuits are required to ensure that the signal sensing period is the right length of time for a given amplitude of signal current. Also, the clocking signals necessitate the fabrication and layout of special metal or conductive lines in and around the sense circuit to route the clock signals. These lines take up valuable space in the usual integrated circuit construction, and since there exists some capacitance between the lines and adjacent components, they cause spurious noise signals to be injected into the circuit when clocked.

Circuits embodying the invention do not need clock signals ad special associated timing circuits to control the length of the "sense" period.

In sense circuits embodying the invention, the conduction path of a first transmission gate is connected between the output of a first inverter and the input to a second inverter, the conduction path of a second transmission gate is connected between the output of the second inverter and the input to the first inverter, and the inputs of the first and second inverters are connected to first and second signal nodes. Means are connected between the nodes and the control electrodes of the transmission gates for turning them on and off as a function of the voltage levels at the nodes. The circuit has a precharge mode, a precharge voltage is applied to the nodes turning off the transmission gates and decoupling the inverters. During the sense mode, first and second current signals, having a polarity to turn on the transmission gates, are applied to the first and second nodes, respectively. When the voltages at the nodes reach a predetermined level, the transmission gates are turned on, cross-coupling the inverters. The inverters then latch to a state controlled by the difference in and sense of the voltages at the nodes. In contrast to previously known circuits, the transmission gates cross-coupling the inverters are controlled by potentials at nodes in the sense circuit itself.

Figure 2:
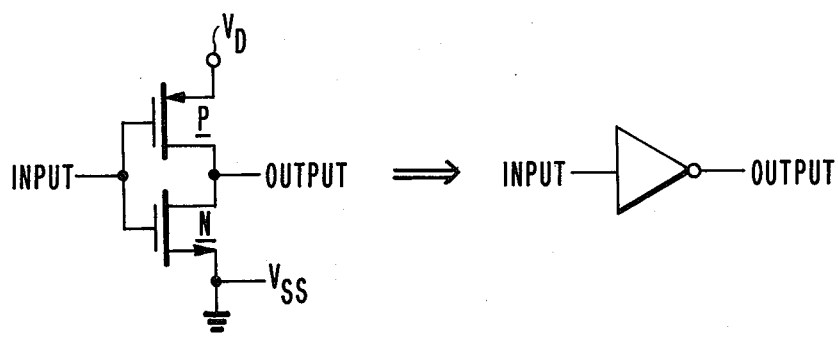
Figure 3:
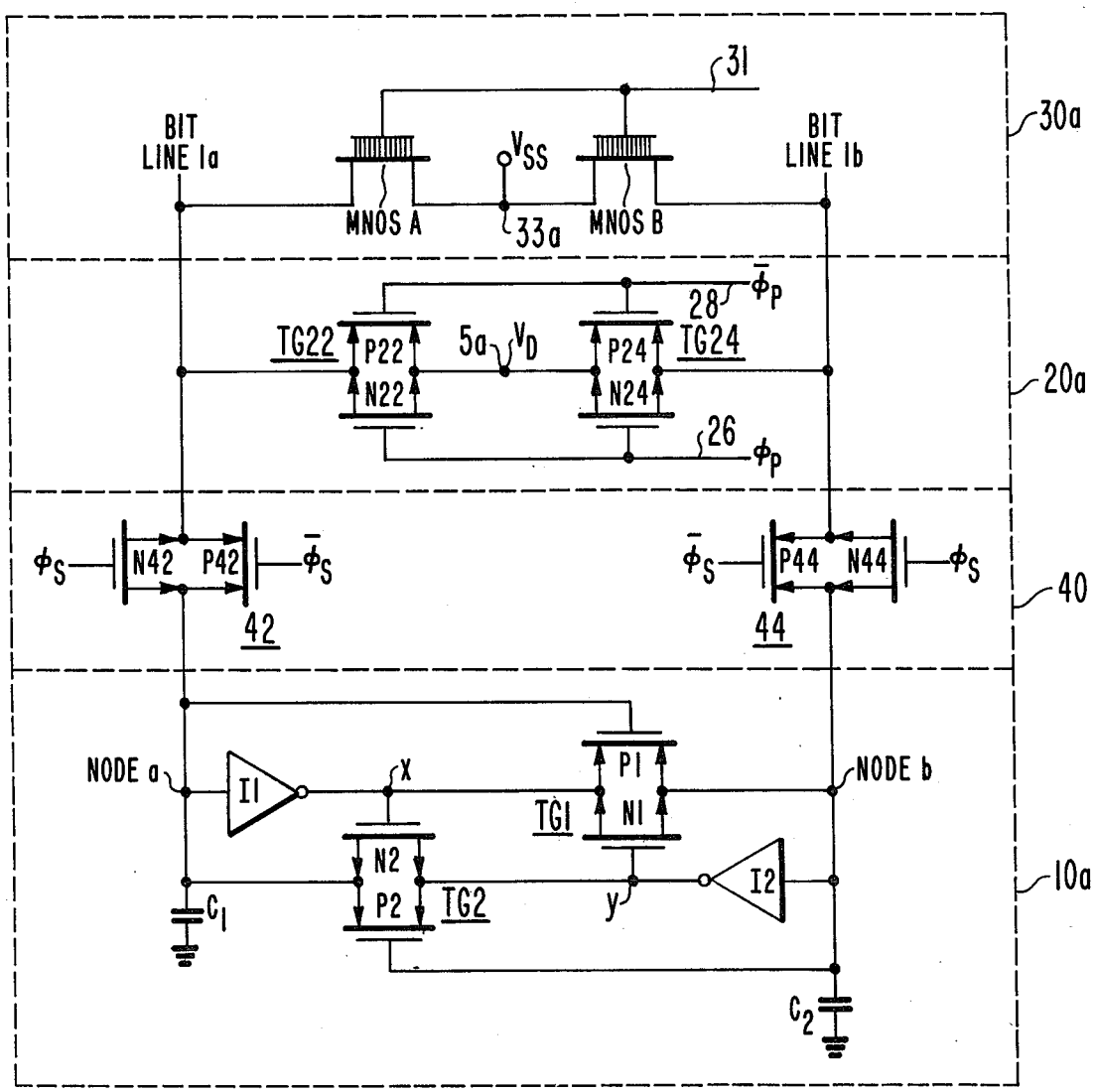
Figure 4:
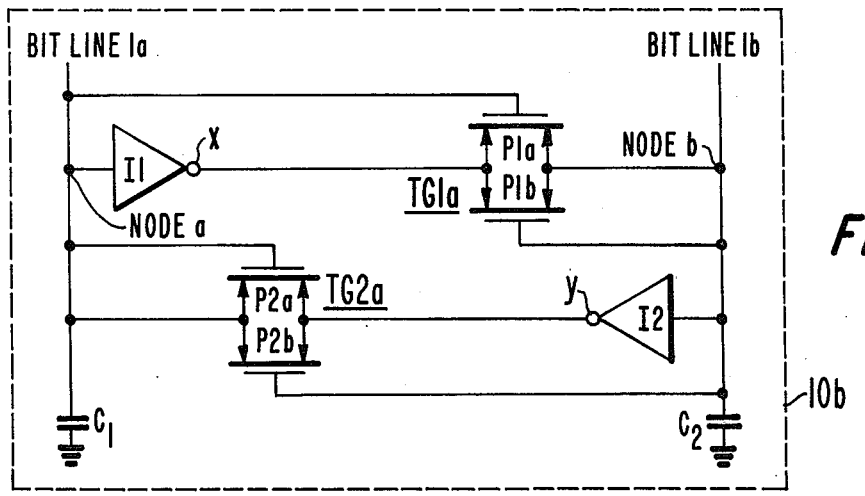

In the accompaying drawings, like reference characters denote like components; and FIGS. 1 and 3 are semi-schematic, semi-block diagram of memory arrays in combination wth sense circuits embodying the invention;

FIG. 2 is a schematic diagram of a complementary inverter useful in practicing the invention; and FIG. 4 is a circuit diagram of another sense circuit embodying the invention.

The circuits illustrated in the Figures include insulated-gate field-effect transistors (IGFETs). However, this is not intended to preclude the use of other suitable devices ad to this end, the term "transistor", when used without limitaion in the appended claims, is used in a generic sense. The IGFETs of P-conductivity type are identified by the letter P followed by a particular reference numeral and an arrow pointing towards the body of the transistor. The IGFETS of N-conductivity type are identified by the letter N followed by a particular reference numeral and an arrow pointing away from the body of the transistor.

The characteristics of IGFETs are well known and need not be described in detail. But, for a clearer understanding of the description to follow, the following definitions and characteristics pertinent to the invention are set forth:

1. The IGFETs used have first and second electrodes which define the ends of a conduction path and a control electrode (gate) whose applied potential determines the conductivity of the conduction path. The first and second electrodes of an IGFET are referred to as the source and drain electrodes. For a P-type IGFET the source electrode is defined as that one of the first and second electrodes having the more positive (higher) potential applied thereto. For an N-type IGFET, the source electrode is defined as that one of the first and second electrodes having less positive (lower) potential aplied thereto.

2. Conduction occurs when the applied gate-to-source potention ($V_{GS}$) is in a direction to forward bias the gate with respect to the source and is greater in magnitude than a given value, which is defined as the threshold voltage ($V_T$) of the transistor.

3. IGFETS are bidirectional in the sense that when an enabling signal is applied to the control electrode, current can flow in either direction in the conduction path defined by the first and second electrodes, i.e. the source and drain are interchangeable.

The system of FIG. 1 includes a sense circuit 10 having two inputs, nodes "a" and "b", to which signals are selectively applied from a precharge circuit 20 or a memory array 30.

Sense circuit 10 includes four (4) inverters I1, I2, I3, I4) and two (2) complementary transistor transmission gates (TG1 and TG2). Inverters I1, I2, I3 and I4 may be, for example, complementary inverters of the type shown in FIG. 2. Each inverter then includes an IGFET of N-conductivity type and an IGFET of P-cnductivity type having their conduction paths connected in series between $V_D$ volts which may be, for example, 5 volts and $V_{ss}$ volts, which may be, for example, ground (zero volts). The drain electrodes of the two IGFETs of each inverter are connected to the inverter output and their gate electrodes are connected to the inverter input. Returning to FIG. 1, inverter I1 is connected at its input to node "a" and inverter I2 is connected at its input to node "b". Inverter I3 is connected at its input to the output (node $x$) of inverter I1 and inverter I4 is connected at its input to te output (node $y$) of inverter I2.

Transmission gate TG1 includes IGFETS P1 and N1 having their conduction paths connected in paralell between nodes $b$ and $x$. Transmission gate TG2 includes IGFETS P2 and N2 having their conduction paths connected in parallel between nodes $y$ and $a$. The gate electrodes of transistors N1, P1, N2 and P2 are connected, respectively, to the output (node $w$) of inverter I3, the output ($y$) of inverter I2, the output ($Z$) of inverter I4, and node $x$.

Capacitors C1 and C2 are shown connected between nodes $a$ and $b$, respectively, and ground. These capacitors represent the stray capacitance as well as any distributed or lumped capacitance which may be specifically added to these nodes. For systems in which different valued signals are applied to nodes $a$ and $b$, capacitors C1 and C2 may be made to have substantially the same value. However, for systems where signals of approximatley equal value may commonly be applied to nodes $a$ and $b$, capacitors C1 and C2 may be made to have different values in order to cause the node with the lower capacitance to charge up more quickly.

To better explain the operation of the sense circuit, memory array 30 which includes metal-nitride-oxide-silicon (MNOS) transistors of P-conductivity type is shown in combiation with it. For purpose of simplicity, only two devices, MNOS transistors A and B, are shown in array 30. Transistors A and B are connected at their sources to a power terminal 33 to which a voltage ($V_T$ of $+V_D$ volts is applied, at their gate electrodes to line 31, and at their drains to bit lines 1a and 1b which are in turn connected to nodes $a$ and $b$, respectively.

MNOS transistors have a threshold voltage which is electrically alterable and which may be set to many different levels. In digital systems, the MNOS transistors are normally set to either a high threshold value ($V_{TH}$) or a low threshold value ($V_{TL}$). One of $V_{TL}$ and $V_{TH}$ is assigned the value of logic zero and the other is assigned the value logic 1. Thus, each memory transistor in array 30 either stores a logic "1" or a logic "0". An MNOS transistor is set to $V_{TH}$ or to $V_{TL}$ by applying a given potential of greater than a given reference value between the gate and the substrate (across the insulating layers) in a direction to either enhance conduction or inhibit conduction. The circuitry necessary to set the MNOS transistors to selected states is not shown. Many such circuits are known and any one of these may be used.

The read out of the contents of the memory elements is controlled by a read voltage $V_R$, applied to line 31. $V_R$ is switched between a first level (e.g. $V_D$ volts) at which the two MNOS transistors are non-conductive and a second level (e.g. $V_D$-$V_{TH}$) at which transistors Q and B are conductive. When $V_R$ is at the second level, MNOS transistors A and B conduct currents from terminal 33 via their conduction paths into nodes $a$ and $b$, respectively. An MNOS transistor which is in the $V_{TH}$ state conducts a low amplitude current ($I_{LC}$), while an MNOS transistor which is in the $V_{TL}$ state conducts a high amplitude current ($I_{HC}$). Memory array 30 may be operated such that MNOS transistors A and B are always set to complementary levels whereby complementary signals, $I_{LC}$ and $I_{HC}$, are applied to bit lines 1a and 1b when the contents of the memory are read out. The memory may also be operated, for example, with MNOS A at either $V_{TL}$ or $V_{TH}$ and with MNOS B, functioning as a reference device, set to one of $V_{TL}$ and $V_{TH}$. For this latter mode of operation, the output of MNOS A is approximately equal to that of MNOS B when the two transistors are in the same state. To avoid ambiguity resulting from this mode of operation capacitors C1 and C2 would be made to have different capacitance values. This ensures that for the same value of current signals, the potentials on nodes $a$ and $b$ are different, thereby avoiding uncertainty of the sense amplifier response to like currents.

Precharge circuit 20, when enabled, couples a potential to nodes $a$ and $b$ having a polarity and magnitude to turn off transmission gates TG1 and TG2. Precharge circuit 20 includes transmission gates TG22 and TG24 having a sufficiently low impedance when conductive that they can clamp nodes $a$ and $b$ to ground regardless of the state of inverters I1 and I2. TG22 includes transistors N22 and P22 having their conduction paths connected in parallel between terminal 5 and node $a$. TG 24 includes transistors N24 and P24 having their conduction paths connected in parallel between terminal 5 and node $b$. The gate electrodes of transistors N22 and N24 are connected to line 26 to which is applied a control signal $\phi_P$ and the gate electrodes of transistors P22 and P24 are connected to line 28 which is applied a control signal $\bar{\phi}_P$ which is the complement of $\phi_P$. When $\phi_p$ is high and $\bar{\phi}_P$ is low, TG22 and TG24 are enabled and transistors N22, P22, P24 and N24 are turned on and clamp nodes $a$ and $b$ to ground. When $\phi_P$ is low, $\bar{\phi}_P$ is high and TG22 and TG24 are disabled.

The "Read" Cycle of the sense circuit includes a precharge mode ($\phi_P$ goes high and $\bar{\phi}_P$ goes low) during which TG22 and TG24 are enabled, and nodes $a$ and $b$ are discharged to ground potential. With nodes a and b at ground potential, the potentials $V_X$ and $V_Y$ at nodes $x$ and $y$, respectively, are high or $V_D$ volts and the potentials $V_W$ and $V_Z$ at nodes $w$ and $z$, respectively, are low or $V_{SS}$ volts. With $V_D$ volts applied to the gates of transistors P1 and P2 and with $V_{SS}$ volts applied to the gates of transistors N1 and N2, transistors P1, P2, N1 and N2 are cut off and gates TG1 and TG2 are disabled. Following the precharge mode, $\phi_p$ and $\bar{\phi}_p$ go low and high, respectively, and TG22 and TG24 are cut off.

The sense circuit is then ready to "read" information contained in the memory and applied to nodes $a$ and $b$. Assume that $V_R$ is driven to the second level rendering transistors A and B conductive. Note that during the "sensing" period, the sense circuit presents a very high resistive impedance to the MNOS devices driving nodes $a$ and $b$. The impedance seen looking in to the sense circuit is essentially capacitive. Therefore, unitl the sense circuit begins to latch, the MNOS devices provide currents that charge capacitance only. There is no current lost or discrepancy due to some input (resistive) impedance looking into the sense circuit not being equal for both sides. A current I$a$ then flows from terminal 33 via the conduction path of MNOS A into node $a$, and simultaneously, a current I$b$ flows from terminal 33 via the conduction path of MNOS B into node $b$. Charging currents I$a$ and I$b$ cause the potentials V$a$ and V$b$ at nodes $a$ and $b$ to rise towards V$_D$ volts. As V$a$ and V$b$ become more positive, V$_X$ and V$_Y$ decrease towards V$_{SS}$ volts and V$_W$ and V$_Z$ increase towards V$_D$ volts.

The gate-to-source potentials (V$_{GS}$) applied to transistors N1 and N2 are in a direction to turn them on and do turn them on as soon as their V$_{GS}$ exceeds their V$_T$. It is clear then, that V$_X$ must decrease and V$_W$ must increase before transistor N1 is turned on. Likewise, V$_Y$ must decrease and V$_Z$ must increase before transistor N2 is turned on. For V$_X$ and V$_Y$ to decrease and V$_Z$ and V$_W$ to increase, the potential at nodes $a$ and $b$ must exceed the threshold (tripping or switching point) level of inverters I1 and I2 and must, therefore, be at a level which is of sufficient amplitude to drive the inverters. Likewise, for transistors P1 and P2 to turn on, V$_X$ and V$_Y$ must decrease sufficiently below V$a$ and V$b$ such that their V$_T$ is exeeceded. Thus when V$_X$ and V$_Y$ are sufficiently low and V$_Z$ and V$_W$ are sufficiently high, transistors P1, N1, P2 and N2 are turned on. For these transistors to turn on V$a$ and V$b$ must be sufficiently high to drive the outputs of inverters I1 and I2 low and the outputs of inverters I3 and I4 high. As soon as TG1 and TG2 turn on, inverter I2 provides positive feedback to the input of inverter I1 and inverter I1 provides positive feedback to the input of inverter I2.

Due to the positive feedback, the sense circuit behaves as a flip flop and is driven to a state indicative of which node ($a$ or $b$) was the first to be charged to the trip point of the sense circuit. If V$a$ is more positive than V$b$, node $a$ is driven to V$_D$ volts and node $b$ is driven to V$_{SS}$ volts. Vice versa, if V$a$ is less than V$b$, when the transmission gates turn on, then node $a$ is driven to V$_{SS}$ volts and node $b$ is driven to V$_D$ volts.

The connections of inverters I3 and I4 provide control signals to transmission gates TG1 and TG2, making the sense circuit "self-latching" in accordance with the present invention. The invention avoids any need to provide clocking signals from outside the sense circuit to control the conduction of cross-coupling transmission gates TG1 and TG2 to latch up the inverters. The "sense period" self-terminates when the data at nodes $a$ and $b$ reach the correct level, where the correct level is defined as the minimum level which will drive the inverters of the sense circuit. The length of the sense period is self-adjusting, automatically taking into account the amplitude of the current signals supplied to data nodes $a$ and $b$. The sense period can, thus, never be to short nor can it ever be too long with corresponding loss of data information.

It is assumed, that the output impedance of inverter I1 in series with the impedance of TG1 and the output impedance of inverter I2 in series with the impedance of TG2 are much lower than the "on" impedances of the memory devices coupled to the sense lines. This enables the sense circuit to drive nodes $a$ and $b$ to the high or low level regardless of the state of the MNOS transistors supplying currents to the lines when the latching of inverter I1 and I2 takes place.

During precharge, nodes $a$ and $b$ are discharged to ground and the transmission gate transistors P1, N1, P2 and N2 are cut off. Subsequently, during a sense period, currents are supplied to nodes $a$ and $b$ charging nodes $a$ and $b$ positively. When the "trip" point of the sense circuit is reached a transition period occurs in which one or more of transistors P1, P2, N1 and N2 are turned on. Inverters I1 and I2 are then cross-coupled via the relatively low impedances provided by the transmission gate transistors. As soon as TG1 and TG2 are enabled, inverters I1 and I2 instantly function as an extremely high gain differential amplifier with positive feedback which then latches to one of two states. In one state, node $a$ is driven to V$_D$ volt level at node $y$ via the conduction path of transistor P2 and node $b$ is coupled to the zero volt level at node $x$ via the conduction path of transistor N1. Transistor N1 and P2 conduct in the common source mode while transistors N2 and P1 are cut off.

In the other state, node $b$ is driven to V$_D$ volts (high) and node $a$ is driven to ground (low). For this voltage condition at nodes $a$ and $b$, transistors P1 and N2 are turned on in the common source mode coupling node $x$ to node $b$ and node $y$ to node $a$, respectively, and transistors N1 and P2 are turned off.

Thus, in the steady latch condition, only one transistor in each transmission gate is turned on. Since the inverters are latched, the fact that only one cross-coupling transistor from each transmission gate is on is sufficient to maintain the inverters in the latched condition.

In sense circuit 10, there is a high margin of safety for correct data sensing and the feedback transmission gates do not turn on until the data to be fed back is correct. For example, assume that node $a$ is charging faster towards V$_D$ then node $b$, then (assuming inverters I1 and I2 to have substantially identical transfer characteristics) node $x$ will fall towards V$_{SS}$ faster than node $y$. Consequently, transistor N1 will turn on before transistor N2 (assuming inverters I3 and I4 to have substantially identical transfer characteristics). The low voltage (or going-low voltage) at node $x$ is delivered to node $b$ via transistor N1 of TG1 operating in the common source mode. This is an important feature since the impedance of the transistor's conduction path is then very low. Even if transistor N2 (or any other transistor) has not yet turned on, node $b$ will be pulled down to ground causing V$_y$ to rise and transistor P2 to turn on. Transistor P2 also operates in the common source mode coupling the positive going V$_y$ to node $a$. This further enhances the initial condition of V$a$ being more positive than V$_b$ and eventually cause V$a$ to be driven to V$_D$ volts and V$b$ to ground and the circuit to be latched. But, it is important to note that the turn on of transistor N1 is dependent upon the value of the voltage at node $x$ and the turn on of transistor N2 is dependent upon the value of the voltage at node $y$. Therefore, the positive feedback is not provided until the data is correct since V$_X$ and V$_Y$ are dependent on V$a$ and V$b$.

Note that V$_R$ can be applied before $\phi_P$ and $\phi_P$ are removed from the precharge transmission gates. Recall that TG22 and TG24 are desired to sink more current than MNOS A and B can source and/or the I1 and I2 inverters can source. Therefore, nodes $a$ and $b$ remain at V$_{SS}$ (or near V$_{SS}$) when V$_R$ is enabled and TG22 and TG24 are turned on. Sensing simply requires $\phi_P$ and $\phi_P$ turning TG22 and TG24 off such that the MNOS A and B are conducting in the common source saturation mode and the rise time is simply the conductance of the transistors times the nodal capacitance. This makes the sensing less dependent on how V$_R$ turns on the two MNOS devices and reduces the effect of switching transients associated with $V_R$ turning them on.

It should be appreciated that alternative circuit configurations may be used to practice the invention. For example, the circuit of FIG. 1 could be modified with the gate electrode, of transistor N1 connected to node with the gate electrode of transistor N2 connected to node b and with inverters I3 and I4 being removed.

The system of FIG. 3 includes a sense circuit 10a that uses just two inverters and two transmission gates and a memory array 30a associated with the sense amplifier whose elements discharge data nodes a and b. In contrast to the memory 30 of FIG. 1, in some systems the memory elements "sink" or draw current from the data lines or nodes. This is illustrated in FIG. 3 where the potential applied to terminal 33a is $V_{SS}$ (ground) and MNOS transistors A and B are operated in the source follower mode. Alternatively transistors A and B could be transistors of N conductivity type operated in the common source mode.

The data lines or nodes a and b of sense circuit 10a used in combination with the system shown in FIG. 3 have to be precharged to a positive voltage prior to being discharged during a subsequent "sense period" by selected memory array elements.

In sense circuit 10a of FIG. 3, as in the circuit of FIG. 1, inverter I1 is connected at its input to node a and the conduction path of TG1 is connected between nodes x and b. Inverter I2 is connected at its input to node b and the conduction path of TG2 is connected between nodes y and a. The gate electrodes of transistors P1 and P2 are directly connected to nodes a and b, respectively, and the gate electrodes of transistors N1 and N2 are connected to nodes y and x, respectively.

The circuit of FIG. 3 includes a selector circuit 40 which, when enabled, couples only two selected bit lines (e.g. 1a and 1b) of the memory array 30a at a time, to the sense circuit and which, when disabled, decouples and thereby isolates the sense circuit from the memory array 30 and the precharge circuit 20a. It should be appreciated that a like selector circuit could be inserted between precharge circuit 20 and sense amplifier 10 in FIG. 1. Circuit 40 includes transmission gates 42 and 44 comprised of transistors N42 and P42 and transistors N44 and P44, respectively, whose conduction paths are connected between line 1a and node a and line 1b and node b, respectively. A select signal $\phi$s is applied to the gate electrodes of transistors N42 and N44 and $\phi$s, the complement of $\phi$s, is applied to the gate electrodes of transistors P42 and P44. In the discussion to follow, it is assumed that gates 42 and 44 are enabled throughout the read cycle.

The operation of the circuit of FIG. 3 differs from that of FIG. 1 in that during the precharge mode, nodes a and b are charged to $V_D$ volts to disable transmission gates TG1 and TG2. This is achieved by applying $V_D$ volts to terminal 5a of precharge circuit 20a whereby, when TG22 and TG24 are turned on, $V_D$ volts is applied via gates 42 and 44 to nodes a and b. The operation of the circuit of FIG. 3 also differs from that of FIG. 1 in that when $V_R$ is applied to line 31, having a polarity and magnitude to turn on transistors A and B, nodes a and b are discharged towards ground via the conduction paths of these transistors.

During a precharge period, nodes a and b are charged to $V_D$ volts via TG22 and TG24. The $V_D$ volts applied to nodes a and b turn off transistors P1 and P2 and cause te levels at nodes x and y to be at zero volts turning off transistors N1 an N2. During the subsequent sense period TG22 and TG24 are turned off and transistors A and B are selected for read out. As soon as these transistors are turned on, each one passes a signal current which discharges its corresponding bit line or node causing the potential at nodes a and b to decrease.

While Va and Vb decrease, $V_X$ and $V_Y$ increase. When $V_X$ is more positive that Va and exceeds the $V_T$ of transistor P1, the latter turns on. When $V_Y$ is more positive than Vb exceeds the $V_T$ of transistor N1, transistor N1 turns on. Conversely, transistor N2 turns on when $V_X$ is more positive than Va and exceeds the $V_T$ of transistor N2 and transistor P2 turns on when Vb is more negative than $V_Y$ and the $V_T$ of P2 is exceeded.

As in the circuit of FIG. 1, as soon as one or more of transistors P1, N1, P2 and N2 is turned on, a transition period is initiated in which the inverters are cross-coupled and eventually latch up to either one of two states. Also as in the circuit of FIG. 1, the transition period is initiated only after the data at one or both of nodes a or b is at the correct level.

As soon as one or more of the cross-coupled transmission gate transistors is, or are, turned on, sense circuit 10a latches to a state indicative of which node was more discharged because it had the higher signal applied to it.

The FIG. 4, sense circuit 10b illustrates that each one of the cross-coupling transmission gates could comprise two transistors of the same conductivity type.

As in FIG. 3, inverters I1 an I2 are connected at their inputs to nodes a and b, respectively. The conduction paths of transistors P1a and P1b, forming gate TG1a, are connected in parallel between the nodes x and b. The conduction paths of transistors P2a and P2b, forming gate TG2a, are connected in parallel between nodes y and a.

In the operation of the circuit of FIG. 4, a precharge signal of $V_D$ volts is applied to nodes a and b to disable transistors P1a, P1b, P2a and P1b. During a subsequent sense period, current signals having a polarity to discharge nodes a and b are applied to them. The data current signals lower the potential at nodes a and/or b causing the potentials at nodes x and/or y to increase to the point that one or more of transistors P1a, P1b, P2s or P2b is turned on. The inverters are then cross-coupled and signals are positively fed back between the outputs and the inputs of the inverters driving them into a latch condition. The sense circuit then assumes a stable state indicative of which input signal was greater when the switching point of the circuit was reached.

What is claimed is:
1. The combination comprising:
first and second nodes;
means for applying a first signal to said first node, and means for applying a second signal, to be compared with said first signal, to said second node;
first and second inverters; each inverter having an input and an output;
means connecting said input of said first inverter to said first node and means connecting said input of said second inverter to said second node;
first and second transmission gates, each transmission gate having a conduction path and a control electrode means for controlling the conductivity of the conduction path;
means connecting the conduction path of said first transmission gate between the output of said first inverter and said second node;

means connecting the conduction path of said second transmission gate between the output of said second inverter and said first node; and means connected between said first and second nodes and said control electrode means of said transmission gates for enabling and disabling said first and second transmission gates in response to the voltage levels at said first and second nodes.

2. The combination as claimed in claim 1, wherein each one of said first and second transmission gates includes first and second transistors, each transistor having a conduction path and a control electrode;

wherein said conduction path of each transmission gate includes the conduction paths of its two transistors connected in parallel;

wherein said control electrode means of each transmission gate includes the control electrodes of its two transistors; and wherein said means connected between said first and second nodes and said control means of said transmission gates includes means coupling the control electrode of each one of said transmission gate transistor to one or the other of said first and second nodes.

3. The combination as claimed in claim 2 wherein said first and second transistors of each transmission gate are of the same conductivity type.

4. The combination as claimed in claim 3 wherein the control electrode of one transistor of each transmission gate is coupled to one of said first and second nodes and wherein the control electrode of the other transistor of each transmission gate is coupled to the other one of said first and second nodes.

5. The combination as claimed in claim 2 wherein said first and second transistors of each transmission gate are of different conductivity type.

6. The combination as claimed in claim 5 wherein the control electrode of one transistor of each transmission gate is coupled to one of said first and second nodes, and wherein the control electrode of the other transistor of each transmission gate is coupled to the other one of said first and second nodes.

7. The combination in claim 5 wherein said means connected between said first and second nodes and said control means of said transmission gates include:

(1) a third inverter connected at its input to the output of said first inverter and at its output to the control electrode of said first transistor of said first transmission gate;

(2) a fourth inverter connected at its input to the output of said second inverter and at its output to the control electrode of said first transistor of said second transmission gate;

(3) means connecting the control electrode of the second transistor of said first transmission gate to the output of said second inverter; and (4) means connecting the control electrode of the second transistor of said second transmission gate to the output of said first inverter.

8. The combination as claimed in claim 7 wherein each one of said first and second inverters includes two insulated-gate field-effect transistors (IGFETs) of complementary conductivity type; and wherein said transistors of said transmission gates are IGFETs.

9. The combination as claimed in claim 1 further including means for supplying a precharge signal to said first and second nodes having a polarity and magnitude to disable said first and second transmission gates; and further including means for supplying current signals to said first and second nodes having a polarity to enable said first and second transmission gates.

10. In a sense circuit having first and second inverters, respectively connected at their inputs to first and second input nodes to which signals to be sensed are applied and further including the conduction path of a first transmission gate connected between the output of the first inverter and the second node, and a second transmission gate connected between the output of the second inverter and the first node, each one of said transmission gate having a control means for controlling the conductivity of its conduction path, the improvement comprising:

means coupled between said first and second nodes and the control means of said first and second transmission gates for enabling and disabling said transmission gates as a function of the voltage levels applied to said first and second nodes.

* * * * *

UNITED STATES PATENT OFFICE
CERTIFICATE OF CORRECTION

PATENT NO. : 4,096,401

DATED : June 20, 1978

INVENTOR(S) : Richard James Hollingsworth

It is certified that error appears in the above-identified patent and that said Letters Patent are hereby corrected as shown below:

Col. 1, line 59 change the word "ad" to --- and ---.

Col. 2, line 4, after the word "mode," add --- a sense mode, and a latch mode. In the precharge mode, ---.

Col. 2, line 29, change the word "ad" to --- and ---.

Col. 3, line 9 should read --example, +5 volts and $V_{SS}$ volts, which may be, for exam- ---.

Col. 3, line 17, change the word "te" to --- the ---.

Col. 3, line 47, change "($V_T$" to --- ($V_T$) ---.

Col. 4, line 40, after "28" insert --- to ---.

UNITED STATES PATENT OFFICE
CERTIFICATE OF CORRECTION

PATENT NO. : 4,096,401

DATED : June 20, 1978

INVENTOR(S) : Richard James Hollingsworth

It is certified that error appears in the above-identified patent and that said Letters Patent are hereby corrected as shown below:

Col. 6, line 57 change "$\phi_P$" (second occurrence) to --- $\overline{\phi_P}$ ---.

Col. 6, line 63 change "$\phi_P$" (second occurrence) to --- $\overline{\phi_P}$ ---.

Col. 7, line 6 after the word "node" insert --- a ---.

Col. 7, line 68 change the word "te" to --- the ---.

Signed and Sealed this

Sixteenth Day of January 1979

[SEAL]

Attest:

RUTH C. MASON
*Attesting Officer*

DONALD W. BANNER
*Commissioner of Patents and Trademarks*